(12) United States Patent
Jung

(10) Patent No.: US 7,758,926 B2
(45) Date of Patent: *Jul. 20, 2010

(54) AMORPHOUS SILICON DEPOSITION FOR SEQUENTIAL LATERAL SOLIDIFICATION

(75) Inventor: Yun-Ho Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 330 days.

This patent is subject to a terminal disclaimer.

(21) Appl. No.: 11/094,187

(22) Filed: Mar. 31, 2005

(65) Prior Publication Data

US 2005/0181136 A1    Aug. 18, 2005

Related U.S. Application Data

(63) Continuation-in-part of application No. 10/157,199, filed on May 30, 2002, now Pat. No. 7,192,627.

(30) Foreign Application Priority Data

May 30, 2001    (KR)    ............................... 2001-29885

(51) Int. Cl.
     *B05D 3/00*      (2006.01)
(52) U.S. Cl. ...................... 427/554; 427/555; 427/556; 427/376.1
(58) Field of Classification Search ................. 427/553, 427/554, 555, 556, 376.1; *B05D 3/00*
See application file for complete search history.

(56) References Cited

U.S. PATENT DOCUMENTS

| | | | | |
|---|---|---|---|---|
| 5,108,843 | A * | 4/1992 | Ohtaka et al. ................ | 428/446 |
| 5,733,641 | A * | 3/1998 | Fork et al. ................... | 428/210 |
| 5,834,071 | A * | 11/1998 | Lin ............................ | 427/578 |
| 6,235,614 | B1 | 5/2001 | Yang | |
| 6,326,286 | B1 * | 12/2001 | Park et al. ................... | 438/478 |
| 6,475,872 | B1 | 11/2002 | Jung | |
| 6,541,316 | B2 * | 4/2003 | Toet et al. ................... | 438/166 |
| 6,573,163 | B2 * | 6/2003 | Voutsas et al. .............. | 438/487 |
| 6,635,555 | B2 | 10/2003 | Voutsas | |
| 6,736,895 | B2 * | 5/2004 | Jung ........................... | 117/37 |
| 6,867,151 | B2 * | 3/2005 | Jung ........................... | 438/778 |
| 6,882,010 | B2 * | 4/2005 | Bhattacharyya ............. | 257/350 |
| 6,949,422 | B2 * | 9/2005 | Kim ............................ | 438/166 |
| 7,192,627 | B2 * | 3/2007 | Jung ........................... | 427/554 |
| 2002/0071064 | A1 | 6/2002 | Moon | |
| 2007/0054473 | A1 * | 3/2007 | Lin et al. .................... | 438/478 |

FOREIGN PATENT DOCUMENTS

| | | |
|---|---|---|
| JP | 07326769 A * | 12/1995 |
| JP | 2002-289525 | 4/2002 |
| KR | 1019990238211 B1 | 10/1999 |
| WO | WO 01/18855 | 3/2001 |

OTHER PUBLICATIONS

Sposili, Robert J, et al., "Sequential lateral solidification of thin silicon films on SiO2". Appl. Phys. Lett. 69 (19), Nov. 4, 1996, pp. 2864-2866.*
Voutsas, A.T. et al., "Effect of process parameters on the structural characteristics of laterally grown, laser-annealed polycrystalline silicon films." Journal of Applied Physics, vol. 94, No. 12, Dec. 15, 2003, pp. 7445-7452.*
Crowder, M.A., et al. "Parametric investigation of SLS-processed poly-silicon thin films for TFT applications." Thin Solid Films, 427, (2003), pp. 101-107.*
Lee, Chang Woo, et al., "Comparison of the stress between rapid thermal annealed and excimer laser annealed polycrystalline silicon thin films." Solid State Communications, vol. 105, No. 12, pp. 777-791, 1998.*
Tang, Y.F., et al., "Super sequential lateral growth of Nd:YAG laser crystallized hydrogenated amorphous silicon". Applied Physics Letters, vol. 78, No. 2, Jan. 8, 2001, pp. 186-188.*
Kim, Yong-Hae, et al., "Large-grain polycrystalline silicon film by sequential lateral solidification on a plastic substrate". Thin Solid Films, 493 (2005) pp. 192-196.*
Y. Helen, High Mobility Thin Film Transistor by Nd: YVO4-Laser Crystallization:, Thin Sold Films, Feb. 15, 2001, vol. 2001, vol. 383, No. 1-2, pp. 143-146.
James S. Im, "Single-Crystal Si Films for Thin-Film Transistor Devices", Applied Physics Letters, Jun. 23, 1997, vol. 70, No. 25, pp. 3434-3436.
Article—Y.H. Jung, et al., "The Dependence of Poly-Si TFT Characteristics on the Relative Misorientation between Grain Boundaries and the Active Channel".
Article—Y.H. Jung, et al., "Low Temperature Poly-Si TFTs Fabricated with Directionally Crystallized Si Film".

* cited by examiner

*Primary Examiner*—Bret Chen
(74) *Attorney, Agent, or Firm*—McKenna Long & Aldridge

(57) ABSTRACT

An amorphous silicon deposition method includes the step of forming a buffer layer on a transparent substrate; depositing amorphous silicon on the buffer layer by a thickness ranging from about 600 to about 2,000 angstroms; repeatedly irradiating the amorphous silicon layer to completely melt using a laser beam that has a complete melting energy density; and moving the laser beam by a transaction distance for the next laser beam irradiation.

4 Claims, 8 Drawing Sheets

AMORPHOUS SILICON DEPOSITION FOR SEQUENTIAL LATERAL SOLIDIFICATION

This application is a Continuation-In-Part (CIP) of application Serial. No. 10/157,199 filed May 30, 2002 now U.S. Pat. No. 7,192,627, and also claims the benefit of Korean Patent Application No. 2001-29885, filed on May 30, 2001 in Korea, which is hereby incorporated by reference as it fully set forth herein.

BACKGROUND OF THE INVENTION

1. Field of the Invention

The present invention relates to an amorphous silicon deposition, and more particularly, to an amorphous silicon deposition method that is useful for sequential lateral solidification (SLS).

2. Discussion of the Related Art

Flat panel display devices that are thin, lightweight, and have low power consumption are in high demand. Flat panel display devices may be classified into two basic types. One type is a light-emitting display device that emits light to display images, and the other is a light-receiving display device that uses external light source to display images. Plasma display panels (PDPs), field emission display (FED) devices, and electro luminescence display devices are examples of light-emitting displays. Liquid crystal displays are examples of light-receiving displays. The liquid crystal display is widely used for laptop computers and desktop monitors because of its superior resolution, color range, and image quality.

Liquid crystal display (LCD) device uses the optical anisotropy and polarization properties of liquid crystal molecules to produce images. Liquid crystal molecules have a definite orientational alignment as a result of their long, thin shapes. That orientational alignment can be controlled by an applied electric field. In other words, as an applied electric field changes, so does the alignment of the liquid crystal molecules. Due to the optical anisotropy, the refraction of incident light depends on the orientational alignment of the liquid crystal molecules. Thus, by properly controlling an applied electric field, a desired light image can be produced.

While various types of liquid crystal display devices are known, active matrix liquid crystal display (AM-LCD) having thin film transistors (TFTs) and pixel electrodes arranged in a matrix are among the most common. This is because an active matrix LCD can produce high quality images at reasonable cost.

The TFTs of LCDs generally include polycrystalline silicon (p-Si) or amorphous silicon (a-Si) as an active layer. Because amorphous silicon (a-Si) can be deposited at a low temperature to form a thin film on a glass substrate, it is more widely used for switching elements in liquid crystal display (LCD) devices. However, amorphous silicon (a-Si) has problems when used in large-area LCD devices because the electrical characteristics of amorphous silicon are problematic. In contrast to amorphous silicon, polycrystalline silicon provides faster display response times when used in TFT switching elements. Thus, polycrystalline silicon (p-Si) is better suited to large-area LCD devices, such as large laptop computers and television sets, which require greater field effect mobility.

During the formation of polycrystalline silicon for LCD applications, laser treatment techniques are frequently used. Such polycrystalline silicon also can be used in the driving circuits for the TFT switching devices.

FIG. 1 is a schematic diagram illustrating a main component of an active matrix liquid crystal display. In FIG. 1, the LCD device includes driving circuits 3 and an active matrix 4 on a substrate 2. The active matrix 4 is located in the central portion of the substrate 2, while the gate driving circuit 3a and the data driving circuit 3b are respectively located in the left and top portions of the substrate 2. In the active matrix 4, a plurality of gate lines 6 are disposed in a transverse direction, and a plurality of data line 8 are disposed in a longitudinal direction (perpendicular to the gate lines 6). Pairs of gate and data lines 6 and 8 define a plurality of pixel regions. The gate driving circuit 3a transfers address signals to the gate lines 6, and the data driving circuit 3b transfers display signals to the data lines in synchronism with the address signals. A plurality of electrically independent pixel electrodes 10 are arranged in pixel regions. At intersections of gate lines 6 and data lines 8 are a plurality of thin film transistors (TFTs) "T" that act as a switching devices. The TFTs form a matrix format, and each TFT "T" corresponds to a particular pixel electrode 10.

The gate driving circuit 3a and the data driving circuit 3b are electrically connected to a control signal input port 12 that is interconnected to a controller (not shown) that controls the gate driving circuit 3a and the data driving circuit 3b. The gate driving circuit 3a and the data driving circuit 3b include CMOS (complementary metal oxide semiconductor) transistors that act as inverters that transfer signals to the pixel electrodes 10. Namely, the gate driving circuit 3a and the data driving circuit 3b are silicon thin film complementary metal oxide semiconductor (CMOS) structures having a shift register. The shift register can be a static or dynamic circuit of complementary (P type and N type) or monoconductive TFTs.

It is very important that an active matrix liquid crystal display (AM-LCD) device similar to FIG. 1 have an active matrix 4 and driving circuits 3 with low off state leakage currents. Additionally, it is important that the CMOS transistors have high field effect mobility. However, polycrystalline silicon used in TFT switches and CMOS transistors have many crystal grains, and thus grain boundaries. Those grains and boundaries interrupt carrier movement and cause deterioration of the active matrix elements. If the grains are larger and the grain boundaries more regularly distributed within the polycrystalline silicon, the field effect mobility increases. Thus, a silicon crystallization method that produces large grains is an important issue.

To solve the problems mentioned above, the crystal field distribution must be controlled, or a single crystal device is required. A technique of forming a single crystalline silicon layer on a glass substrate by sequential lateral solidification (SLS) is described in Robert S. Sposilli, M. A. Crowder, and James S. Im, Mat. Res. Soc. Symp. Proc. Vol. 452, 956-957, 1997. That technique uses the fact that silicon grains tend to grow laterally from the interface between liquid and solid silicon. Based on that principle the reference teaches crystallizing amorphous silicon layer by controlling the laser energy and irradiation range of a moving laser beam to produce silicon grains having predetermined length, as shown in the following example. Accordingly, sequential lateral solidification (SLS), which induces lateral growth of silicon grains, can form single-crystal silicon film using laser energy.

FIG. 2 is a graph illustrating grain size verses laser energy density, and FIGS. 3A-3C present cross-sectional views for explaining the mechanism of forming p-Si film composed of large grains. As illustrated in FIGS. 3A to 3C, a buffer layer 12 and an amorphous silicon layer 14 are sequentially formed on a transparent substrate 1.

Referring now to FIGS. 2 and 3A, the first regions is a partial melted region. When a laser beam having an energy density within the first region irradiates the amorphous silicon layer 14, only a surface portion "A" of the amorphous silicon layer 14 is melted. Thereafter, during an annealing process a plurality of small grains "G1" are formed in a vertical direction.

The second region of FIG. 2 illustrates a laser beam having an energy density that nearly melts the entire region. When a laser beam having an energy density in the second region irradiates the amorphous silicon layer 14, almost all of the amorphous silicon is melted, as illustrated in FIG. 3B. Furthermore, a plurality of seeds 13 is formed between the amorphous silicon layer 14 and the buffer layer 12. Due to the seeds 13, the silicon grains tend to grow horizontally. However, because the plurality of seeds 13 are distributed randomly over the transparent substrate 1, it is difficult to obtain a plurality of uniform grains "G2" even though the grains "G2" are larger.

The third region of FIG. 2 illustrates a complete melting regime. When a laser beam having an energy density within the third region irradiates the amorphous silicon layer 14, all of the amorphous silicon is melted, (see FIG. 3C). Then, homogeneous nucleation is conducted during the annealing process. Therefore, a plurality of nuclei 15 is formed in the melted silicon, and fine grains "G3" are obtained.

In view of above-mentioned silicon crystallization mechanism, suitable laser energy densities may be obtained experimentally. The region of suitable laser energy densities is be referred to as a process window.

FIG. 4 schematically illustrates sequential lateral solidification (SLS). When a first laser beam having an energy density that completely melts the amorphous silicon layer 20, is applied a first complete melting region "I" is induced. Furthermore, a plurality of seeds 24 are formed at interfaces 24 between the solid phase amorphous silicon and the liquid phase silicon due to the liquid-solid phase contact. During annealing, the plurality of seeds 24 tend to grow laterally (the opposing vertical directions illustrated in FIG. 4), thereby generating a plurality of first grains 26. Furthermore, during annealing a plurality of fine grains 28 may be formed near the middle of the first melting region "I", and thus the first grains 26 divides that region into two parts.

After forming the first grains 26, a second laser beam having an energy density that completely melts the silicon layer is applied. The second laser beam beneficially has the same energy density and beam width as the first laser beam. Before the second laser beam irradiates the substrate 22, it is moved such that the bottom area of the first melting region "I" (portion II) and the fine grains 28 will be irradiated. The second laser irradiation completely melts the portion "II" a second time and re-melts the first grains. During annealing the first grains 26 of the top area "III" tend to grow laterally until it forms a single crystal grain 30. Namely, the single crystal grains 30 are formed by repeating the first and second laser beam irradiation and annealing processes.

In the above-mentioned SLS process the distance between the first and second laser beam irradiations is beneficially the length of lateral growth of the first grains 26 in the top area "III". That length is often referred to as a translation distance. By way of adjusting the translation distance, the fine grains 28 must be removed from the middle of the first laser beam width "I".

For example, a laser beam having a beam width of 1 to 3 millimeters may be used and an overlapping ratio of 90% is suitable. The amorphous silicon layer is usually formed with a thickness of 500 angstroms. If the thickness of the amorphous silicon layer was greater than 500 angstroms, the laser beam would have to have a greater laser density energy to melt the thicker amorphous silicon, which would increase manufacturing costs and possibly slow down the fabrication process, with no improvement in the characteristics of the thin film transistors being produced. Accordingly, when depositing the amorphous silicon to induce the polycrystalline silicon, the amorphous silicon layer should maintain a thickness ranging from 500 to 600 angstroms.

Since SLS crystallization uses a laser beam having an energy density sufficient to completely melt the silicon layer, the thickness of the amorphous silicon layer is an important issue. If the amorphous silicon layer has a thickness of about 500 angstroms, defects occur during SLS crystallization. When the translation distance is short defects such as a pilling phenomenon and an agglomeration phenomenon may occur and the range of the process window decreases.

FIG. 5 illustrates laser energy density during SLS crystallization when the amorphous silicon layer has a thickness of 500 angstroms. In SLS crystallization, when the laser energy density is about 410 mJ/cm$^2$ for the formation of single crystal silicon, the translation distance can range from 0.05 to 0.9 micrometers to compose the process window. Furthermore, when the laser energy density is about 450 mJ/cm$^2$, the translation distance ranges from 0.6 to 1.0 micrometers.

If the translation distance is more than 0.95 micrometers at a laser energy density of 425 mJ/cm$^2$, as shown in FIG. 5, the resulting silicon becomes polycrystalline silicon instead of single crystalline silicon. On the other hand, if the translation distance is less than 0.3 micrometers at an laser energy density of 425 mJ/cm2, the resulting silicon becomes crystalline silicon having dome defects, such as pilling and agglomeration. Accordingly, 500 angstroms thick amorphous silicon has a narrow process window and is susceptible to defects.

SUMMARY OF THE INVENTION

Accordingly, the present invention is directed to an amorphous silicon deposition method for sequential lateral solidification (SLS) that substantially obviates one or more of the problems due to limitations and disadvantages of the related art.

An advantage of the present invention is to provide an amorphous silicon deposition method for sequential lateral solidification (SLS) that increases the process window.

Another advantage of the present invention is to provide an amorphous silicon deposition method for sequential lateral solidification (SLS) that increases the manufacturing yield and the product stability.

Additional features and advantages of the invention will be set forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the present invention, as embodied and broadly described, an amorphous silicon deposition method for sequential lateral solidification (SLS) includes the step of forming a buffer layer on a transparent substrate; depositing amorphous silicon on the buffer layer at a thickness ranging from 600 to 2,000 angstrom (beneficially 600 to 900 angstroms); repeatedly irradiating the amorphous silicon layer so as to completely melt that layer using a laser beam that has a complete melting energy density; and moving the laser beam by a translation distance for the next laser beam irradiation.

The above-mentioned method further includes annealing the molten silicon layer to form a single crystalline silicon layer after each laser beam irradiation. Laser energy density ranges from about 310 to about 2 J/cm$^2$ are suitable. When the laser beam has an energy density ranging from about 310 to about 2 J/cm$^2$, the maximum translation distance ranges from about 0.2 to about 5.0 micrometers and the minimum translation distance ranges from about 0.04 to about 0.1 micrometers. Beneficially, the amorphous silicon layer deposited on the buffer layer is about 1,000 angstroms thick.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to illustrated embodiments of the present invention, examples of which are shown in the accompanying drawings. Wherever possible, similar reference numbers will be used throughout the drawings to refer to the same or similar parts.

Figure 6:
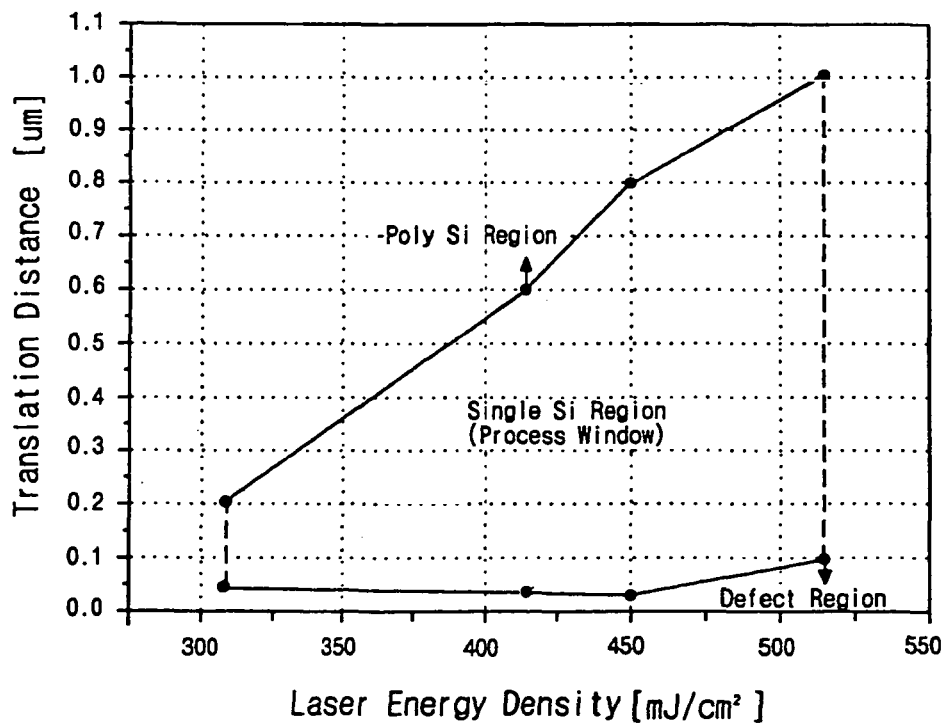
FIG. 6 is a graph illustrating a laser energy density that can frame a process window during SLS crystallization when the amorphous silicon layer has a thickness of 1,000 angstroms.

FIG. 6 is a graph illustrating a laser energy density that can frame a process window during SLS crystallization when the amorphous silicon layer has a thickness of 1,000 angstroms according to the present invention. When the laser energy density is 310 mJ/cm$^2$, the maximum translation distance is 0.2 micrometers and the minimum translation distance is 0.05 micrometers. Laser energy density of 415 mJ/cm$^2$ corresponds to a maximum translation distance of 0.6 and a minimum translation distance of 0.04 micrometers, the laser energy density of 450 mJ/cm$^2$ corresponds to a maximum translation distance of 0.8 and a minimum of translation distance 0.04 micrometers, and a laser energy density of 515 mJ/cm$^2$ corresponds to a maximum translation distance of 1.0 and to a minimum translation distance of 0.1 micrometers.

Figure 1:
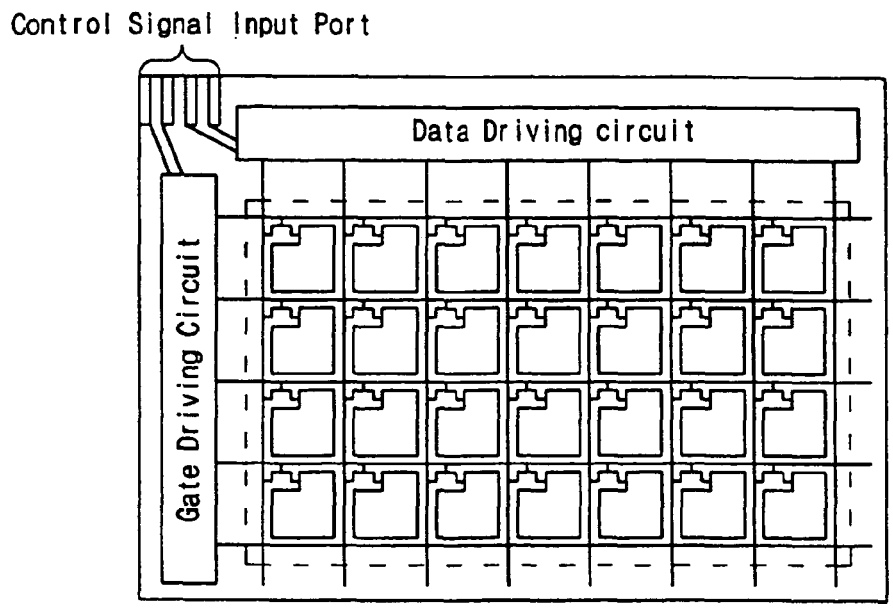
FIG. 1 is a schematic block diagram illustrating the main component of an active matrix liquid crystal display.
Figure 2:
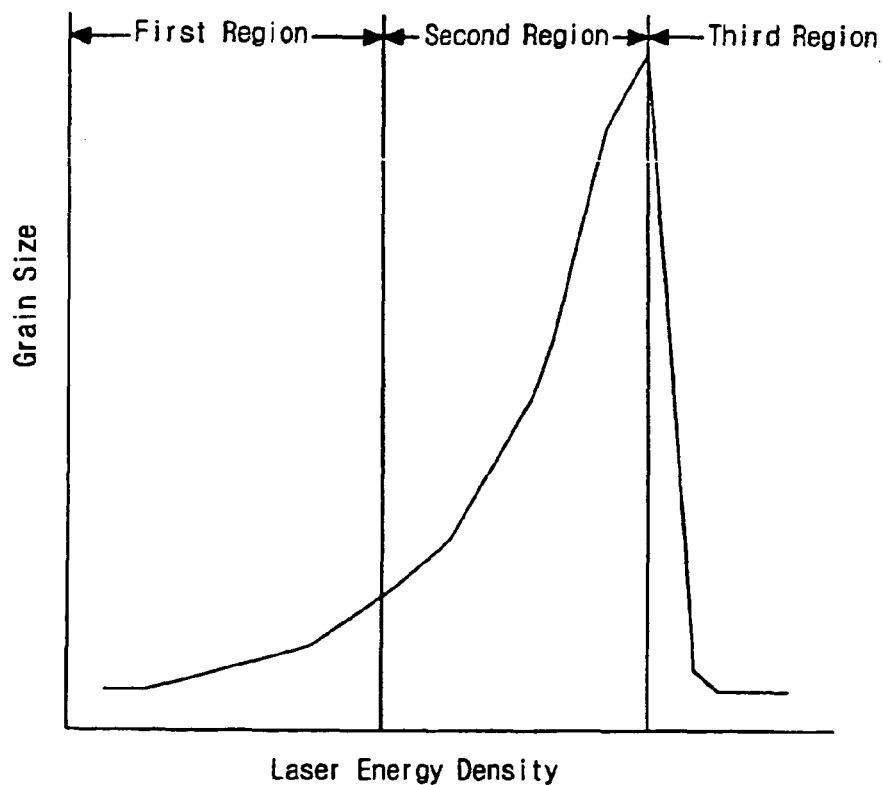
FIG. 2 is a graph illustrating grain size verses laser energy density.
Figure 3A:
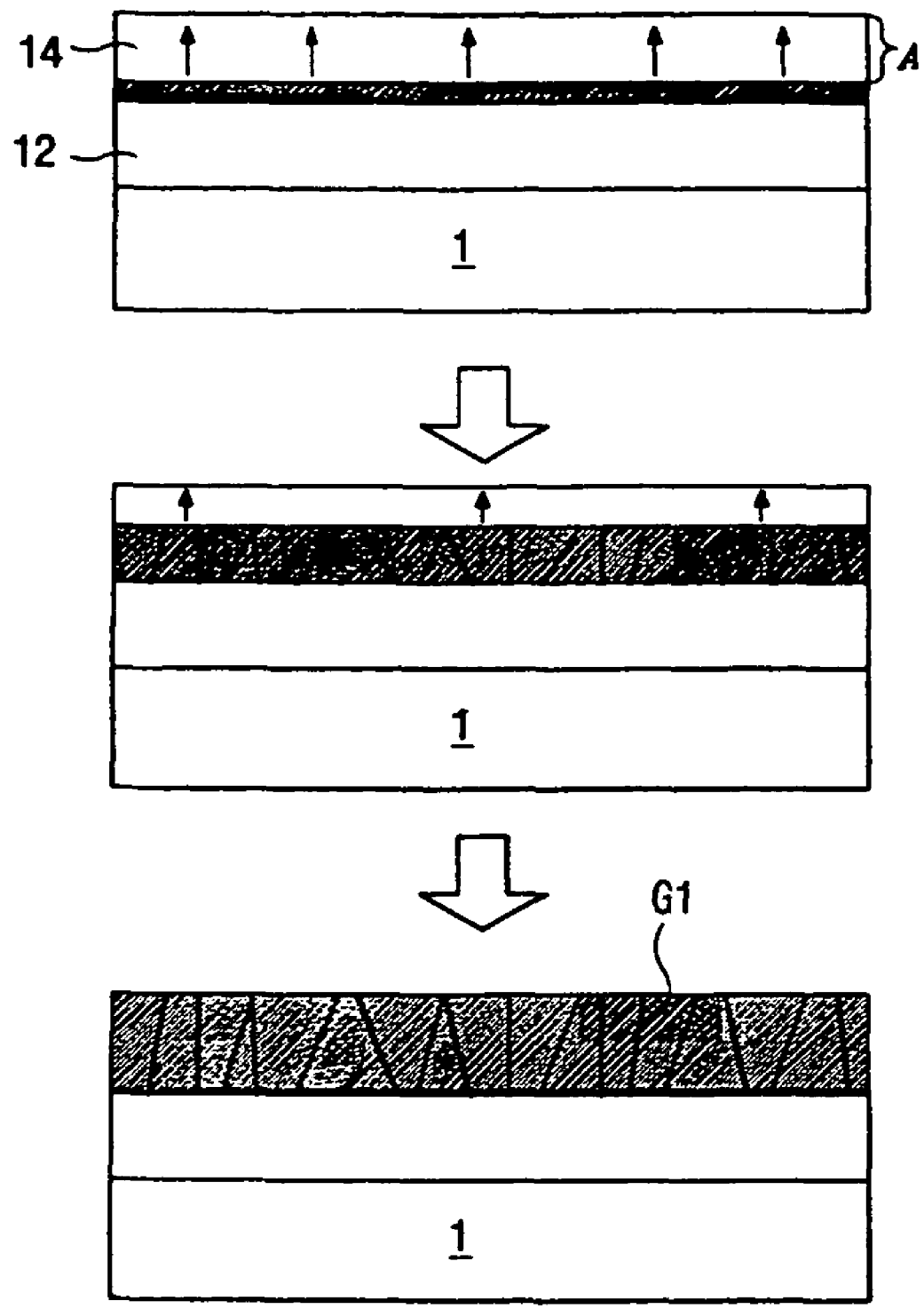
FIGS. 3A-3C are cross-sectional views illustrating the crystallization of a-Si film using SLS.
Figure 3B:
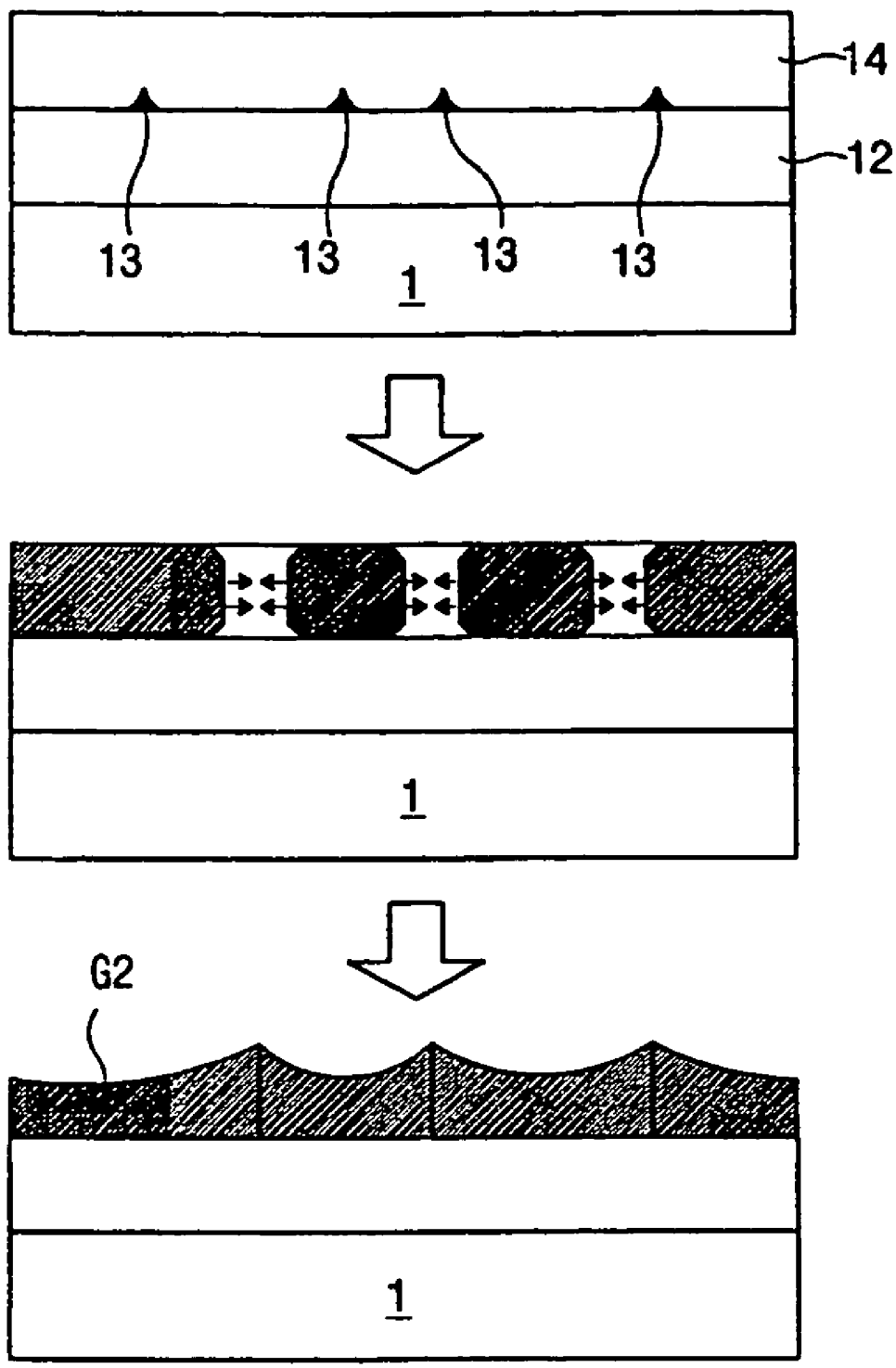
Figure 3C:
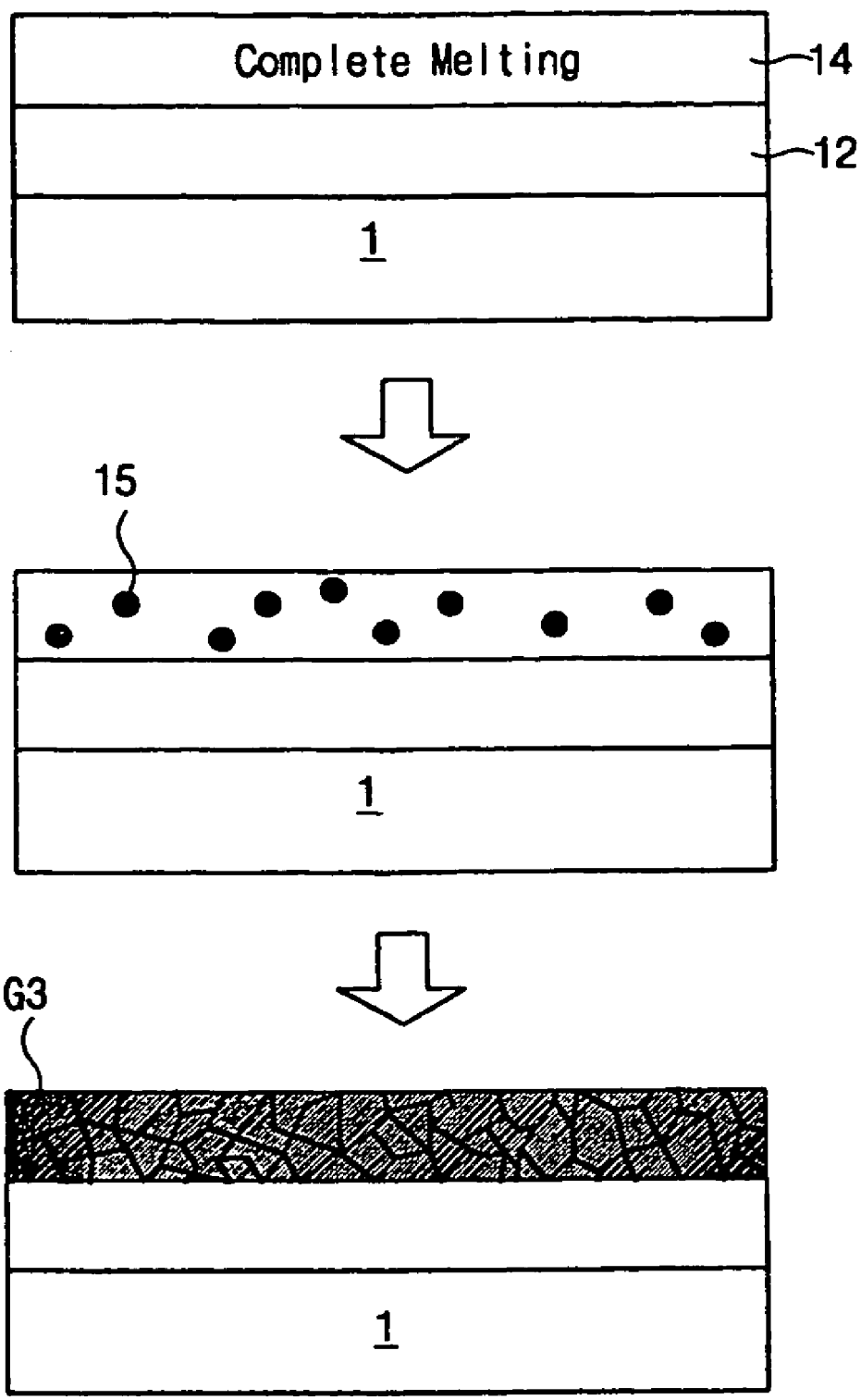
Figure 4:
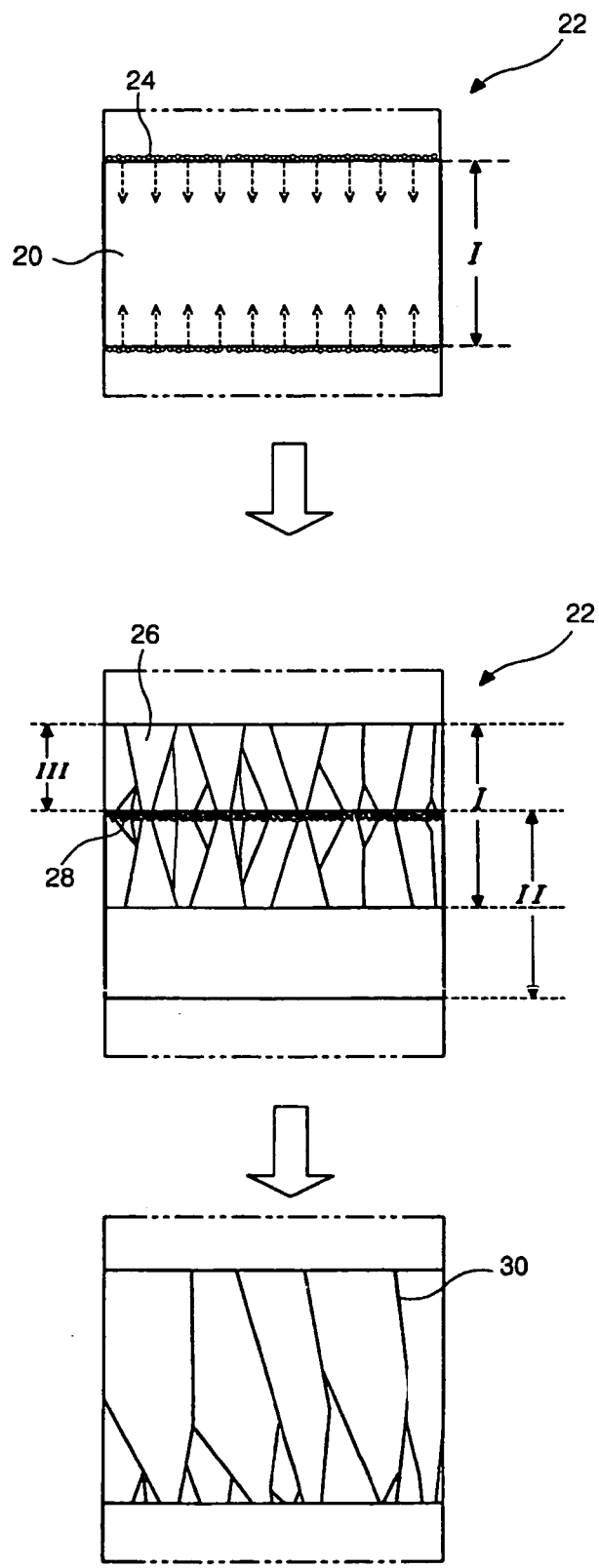
FIG. 4 is process drawings illustrating sequential lateral solidification (SLS)
Figure 5:
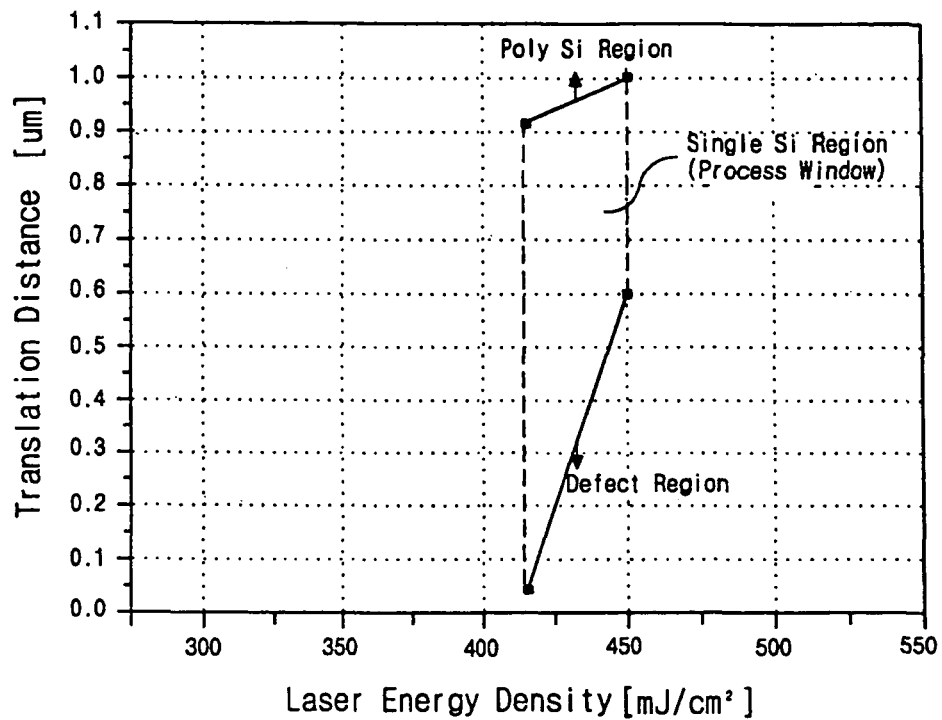
FIG. 5 is a graph illustrating laser energy densities that can frame a process window during SLS crystallization when the amorphous silicon layer has a thickness of 500 angstroms.

Compared with FIG. 5, FIG. 6 illustrates a much larger process window. Namely, since the amorphous silicon layer is deposited at a thickness of 1,000 angstroms (larger than the conventional art) the process window is wider range. Furthermore, defects, such as pilling and agglomeration, occur at a short translation distance than in the conventional art. For example, when a laser beam having an energy density of 415 mJ/cm$^2$ irradiates the silicon layer to form single crystalline silicon, the defects occur below a transaction distance of 0.04 micrometers. Accordingly, the width of the process window increases. Furthermore, although the amorphous silicon is larger than in the conventional art, the energy consumption of the laser beam does not greatly increase.

Figure 7:
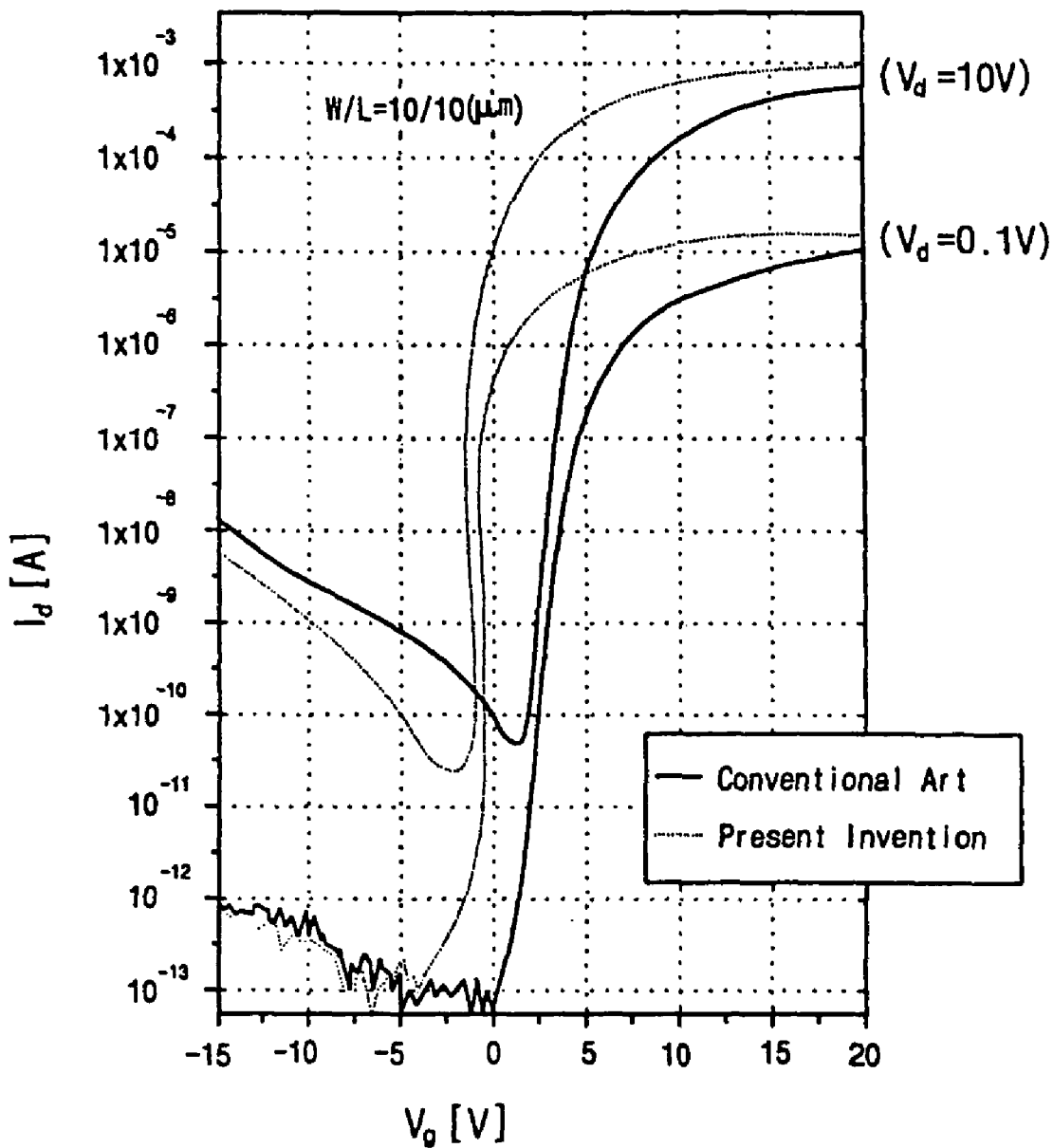
FIG. 7 is a graph illustrating a transfer characteristics comparison between the conventional art and the present invention.

FIG. 7 is a graph illustrating a transfer characteristic comparison between the conventional art and the present invention. As the gate voltage $V_g$ was gradually increased from −15V to +20V at a fixed rate, the variation of the drain current $I_d$ flowing through an active channel layer was measured. Further, the drain voltage $V_d$ was set at 0.1V and 10V ($V_d$=0.1V and $V_d$=10V), while the transfer characteristics are measured. The amorphous silicon layer of the conventional art was 500 angstroms thick while the amorphous silicon layer of the present invention was 1,000 angstroms thick.

As illustrated in FIG. 7, when the drain voltage $V_d$ was 0.1V, the field effect mobility of the thin film transistor was 230 cm$^2$/V·s using conventional silicon of 500 angstroms thick. On the contrary, when the drain voltage $V_d$ was 10V, the field effect mobility of the thin film transistor was 390 cm$^2$/V·s in the inventive silicon of 1,000 angstroms thick. Moreover, when the drain voltage $V_d$ was 10V, it was shown that the leakage current was lower in the thin film transistor having the inventive silicon layer rather. Therefore, the thin film transistor having an active layer made from amorphous silicon layer that is 1,000 angstroms thick can have improved electrical characteristics. As a result of the experiment shown in FIG. 7, the amorphous silicon layer should be between 600 to 2,000 angstroms thick according to the present invention when the amorphous silicon is crystallized by SLS and used as an active layer of the thin film transistor.

Figure 8:
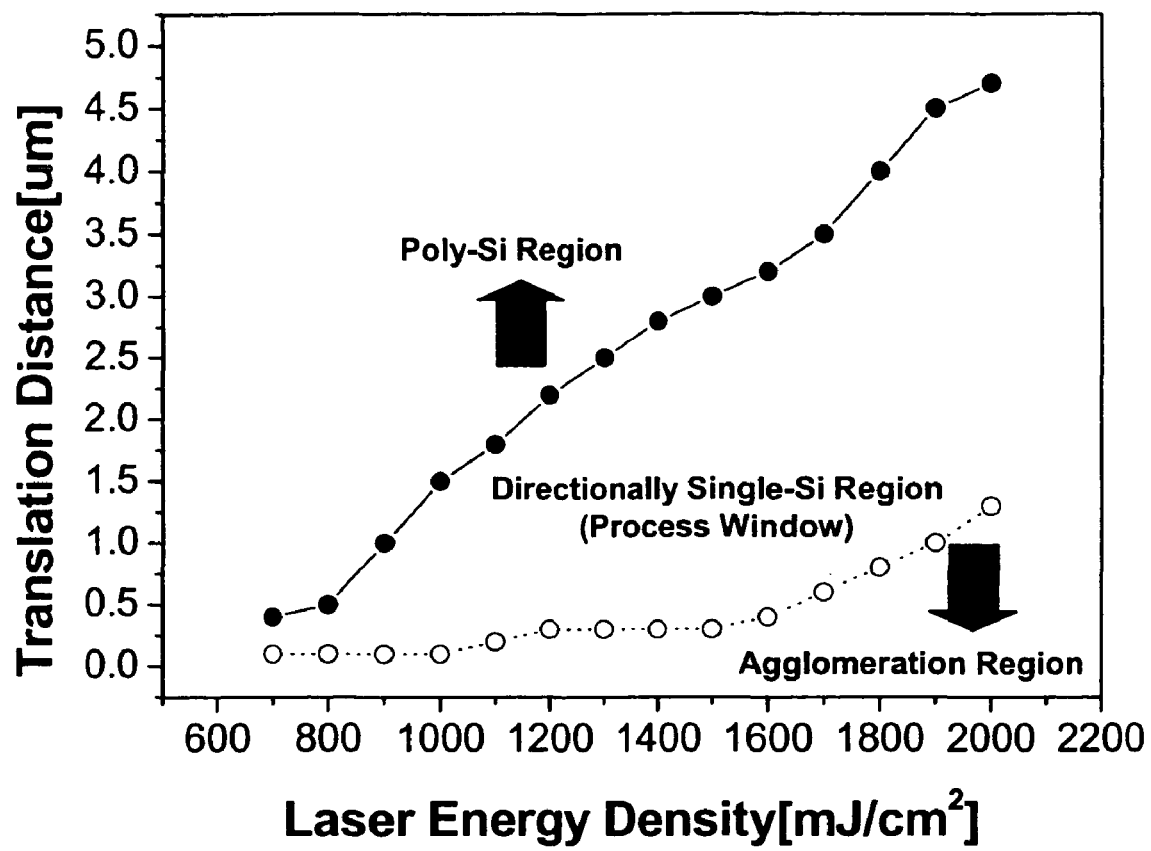
FIG. 8 is a graph illustrating a laser energy density that can frame a process window during SLS crystallization.

FIG. 8 is a graph illustrating a laser energy density that can frame a process window during SLS crystallization when the amorphous silicon layer has a thickness of 1,000 angstroms according to the present invention. When the laser energy density is 700 mJ/cm$^2$, the maximum translation distance is 0.3 micrometers and the minimum translation distance is 0.15 micrometers. Laser energy density of 1.2 J/cm$^2$ corresponds to a maximum translation distance of 2.25 and a minimum translation distance of 0.25 micrometers, the laser energy density of 1.7 J/cm$^2$ corresponds to a maximum translation distance of 3.5 and a minimum of translation distance 0.6 micrometers, and a laser energy density of 2 J/cm$^2$ corresponds to a maximum translation distance of 4.75 and to a minimum translation distance of 1.8 micrometers.

As described above, if single crystalline silicon layer is formed from amorphous silicon depositions in accord with the present invention, the field effect mobility of the thin film transistor is improved, and thus the thin film transistor is suitable for use in liquid crystal displays having high resolution. Namely, the silicon layer of the present invention may be employed as elements of CMOS transistors that are in the driving circuits of a liquid crystal display having excellent image quality.

It will be apparent to those skilled in the art that various modifications and variations can be made in the method of crystallizing the amorphous silicon without departing from the spirit or scope of the inventions. Thus, it is intended that the present invention cover the modifications and variations of this invention provided they come within the scope of the appended claims and their equivalents.

What is claimed is:

1. A crystallization method, comprising:
forming a buffer layer on a transparent substrate;
depositing an approximately 1000 angstrom thick amorphous silicon layer on the buffer layer;
forming a polycrystalline silicon layer using a sequential lateral solidification process to form a laterally grown grain by repeatedly irradiating the amorphous silicon layer using a laser beam that completely melts a region of the amorphous silicon layer; and
moving the laser beam a translation distance between irradiations so that subsequent irradiations of the amorphous silicon layer overlap a previously irradiated region,
wherein the laser beam has an energy density between about 1.2 J/cm$^2$ and about 2 J/cm$^2$.

2. .The method according to claim 1, further comprising annealing the silicon layer melted between irradiations.

3. The method according to claim 1, wherein the maximum translation distance ranges from about 2.25 to about 4.75 micrometers.

4. The method according to claim 1, wherein the minimum translation distance ranges from about 0.25 to about 1.8 micrometers.

* * * * *